United States Patent
Park

(10) Patent No.: US 9,576,544 B2
(45) Date of Patent: Feb. 21, 2017

(54) GATE DRIVER AND DISPLAY APPARATUS HAVING THE SAME

(71) Applicant: SAMSUNG DISPLAY CO., LTD., Yongin, Gyeonggi-Do (KR)

(72) Inventor: Jung Mok Park, Yongin, Gyeonggi-Do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 469 days.

(21) Appl. No.: 14/014,751

(22) Filed: Aug. 30, 2013

(65) Prior Publication Data

US 2014/0292628 A1    Oct. 2, 2014

(30) Foreign Application Priority Data

Apr. 2, 2013  (KR) ......................... 10-2013-0035940

(51) Int. Cl.
*G09G 3/36* (2006.01)
*G11C 19/28* (2006.01)

(52) U.S. Cl.
CPC ............ *G09G 3/3677* (2013.01); *G11C 19/28* (2013.01); *G09G 2310/0286* (2013.01)

(58) Field of Classification Search
CPC ................ G09G 3/3611; G09G 3/3677; G09G 2310/0286; G11C 19/28
USPC . 345/87, 92, 98, 99, 100, 205, 206; 327/108
See application file for complete search history.

(56) References Cited

U.S. PATENT DOCUMENTS

| | | | | |
|---|---|---|---|---|
| 6,097,055 A | * | 8/2000 | Lee | ......................... H01L 28/91 257/296 |
| 6,281,865 B1 | * | 8/2001 | Koyama | ............... G02F 1/1362 345/100 |
| 2002/0036348 A1 | * | 3/2002 | Matsunaga | ....... H01L 23/53238 257/758 |
| 2002/0190301 A1 | * | 12/2002 | Hsue | ....................... H01L 28/55 257/306 |
| 2005/0174344 A1 | * | 8/2005 | La | ......................... G02F 1/1362 345/208 |
| 2008/0048712 A1 | * | 2/2008 | Ahn | ..................... G09G 3/3677 326/21 |
| 2008/0062373 A1 | | 3/2008 | Kim et al. | |
| 2008/0088555 A1 | * | 4/2008 | Shin | ..................... G09G 3/3677 345/87 |
| 2011/0074743 A1 | * | 3/2011 | Son | .......................... G09G 3/20 345/204 |
| 2012/0098800 A1 | * | 4/2012 | Kim | ..................... G09G 3/3677 345/204 |

FOREIGN PATENT DOCUMENTS

| KR | 10-2006-0009749 A | 2/2006 |
|---|---|---|
| KR | 10-2008-0023466 A | 3/2008 |
| KR | 10-2011-0079605 A | 3/2008 |
| KR | 10-2012-0040918 A | 4/2012 |

\* cited by examiner

*Primary Examiner* — Amare Mengistu
*Assistant Examiner* — Stacy Khoo
(74) *Attorney, Agent, or Firm* — Lee & Morse P.C.

(57) ABSTRACT

A gate driver includes a line part to receive control signals and a shift register to sequentially output gate signals in response to the control signals provided from the line part. The line part and the shift register are disposed apart from each other with a first distance equal to or greater than about 20 μm.

18 Claims, 5 Drawing Sheets

GATE DRIVER AND DISPLAY APPARATUS HAVING THE SAME

CROSS-REFERENCE TO RELATED APPLICATION

Korean Patent Application No. 10-2013-0035940, filed on Apr. 2, 2013, in the Korean Intellectual Property Office, and entitled: "Gate Driver and Display Apparatus Having the Same," is incorporated by reference herein in its entirety

BACKGROUND

1. Field

The present disclosure relates to a gate driver and a display apparatus having the gate driver.

2. Description of the Related Art

In recent years, various display devices, such as a liquid crystal display, an organic light emitting diode display, an electrowetting display device, an electrophoretic display device, a nanocrystal display, etc., have been developed.

In general, the display device includes a plurality of pixels that displays an image, a gate driver that applies gate signals to the pixels, and a data driver that applies data voltages to the pixels. The pixels receive the data voltages in response to the gate signals and display the image corresponding to the data voltages. The gate driver includes a line part that receives control signals and a shift register that sequentially generates the gate signals in response to the control signals.

SUMMARY

Embodiments provide a gate driver including a line part that receives control signals and a shift register that sequentially outputs gate signals in response to the control signals provided from the line part. The line part is disposed apart from the shift register with a first distance equal to or greater than about 20 μm.

The line part includes a plurality of signal lines to receive the control signals and provide the control signals to the shift register, the shift register includes a plurality of stages connected one after another to each other to sequentially output the gate signals in response to the control signals provided from the signal lines, and a signal line of the signal lines, which is disposed adjacent to the stages, is disposed apart from the stages with the first distance.

The control signals include a vertical start signal, a first clock signal, a second clock signal having a phase opposite to the first clock signal, and an off-voltage defined as a ground voltage. The signal lines include a first signal line that receives the vertical start signal and applies the vertical start signal to a first stage and a last stage among the stages, a second signal line that receives the first clock signal and applies the first clock signal to the stages, a third signal line that receives the second clock signal and applies the second clock signal to the stages, and a fourth signal line that receives the off-voltage and applies the off-voltage to the stages.

Each of the stages includes a pull-up part that receives the first clock signal and pulls up the gate signal in response to a voltage of a first node, a pull-down part that pulls down the gate signal to the off-voltage in response to a voltage of a second node and the second clock signal, a pull-up driving part that is connected to the first node, turns on the pull-up part in response to a gate signal of a previous stage, and turns off the pull-up part in response to a gate signal of a next stage, a ripple preventing part that maintains the first node at the off-voltage in response to the voltage of the second node, a pull-down control part that converts the voltage of the second node in response to the voltage of the first node to turn off the ripple preventing part, and a switching capacitor that receives the first clock signal to store the first clock signal and applies the stored first clock signal to the second node. The pull-up driving part receives the vertical start signal when the previous stage or the next stage does not exist.

The switching capacitor and the first signal line are disposed adjacent to each other, and the first signal line and the switching capacitor are disposed apart from each other with the first distance.

The switching capacitor includes a plurality of openings, and an entire area of the openings is greater than about 40% of an entire area of the switching capacitor that is defined by an outer boundary of the switching capacitor.

Embodiments provide a display apparatus including a plurality of pixels that receives data signals in response to gate signals and displays grayscales corresponding to data signals, a gate driver that sequentially applies the gate signals to the pixels in response to gate control signals, and a data driver that applies the data signals to the pixels. The gate driver includes a line part that receives control signals and a shift register that sequentially outputs the gate signals in response to the control signals provided from the line part, and the line part is disposed apart from the shift register with a first distance equal to or greater than about 20 μm.

Embodiments provide a gate driver including a line part that receives control signals and a shift register that sequentially outputs gate signals in response to the control signals provided from the line part. A line in the line part closest to the shift register is separated from a capacitor closest to the line part by a first distance equal to or greater than about 20 μm.

The line and an electrode of the capacitor may be at a same level and separated by the first distance.

The line and the electrode may be on a same surface of a substrate.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
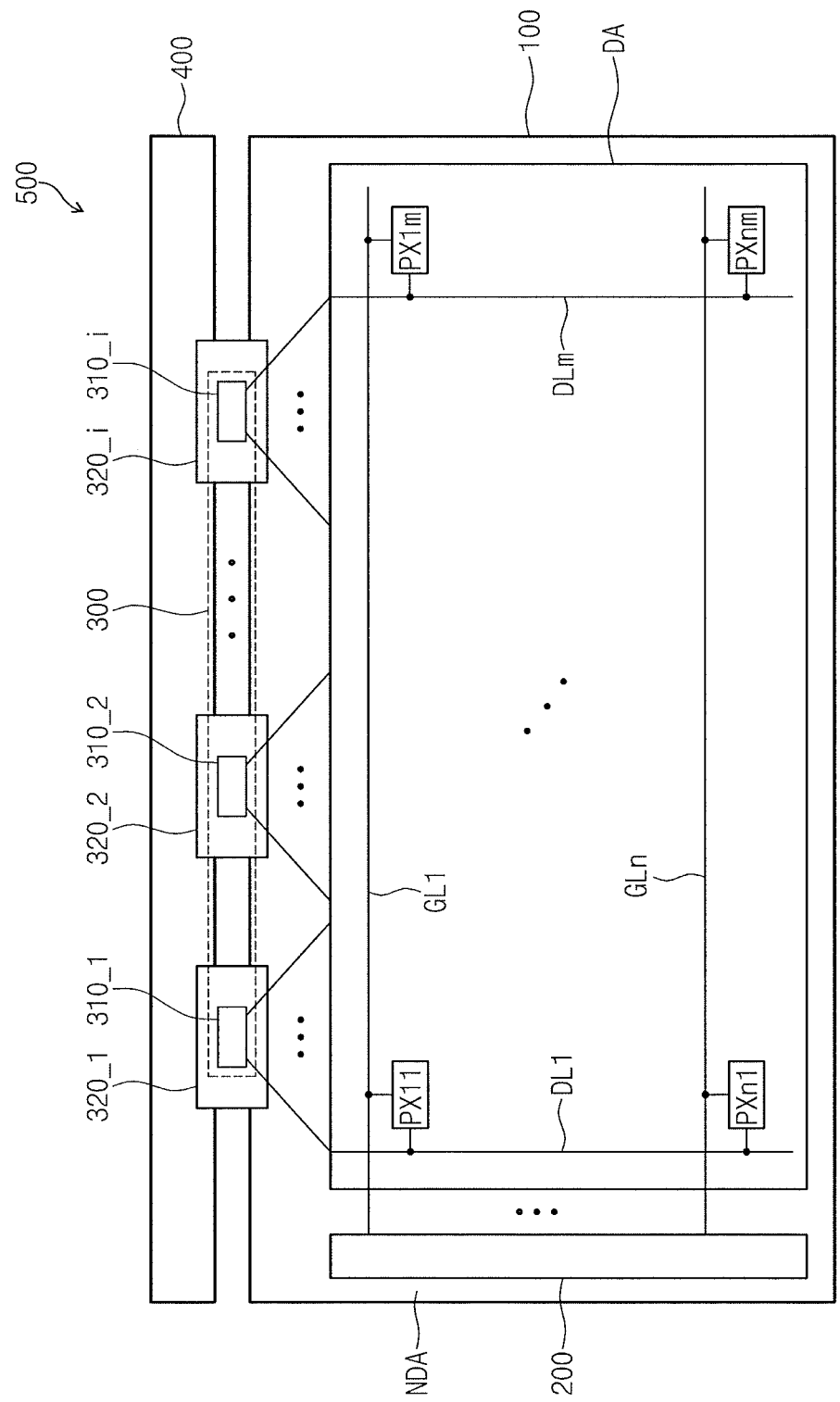
FIG. 1 illustrates a plan view of a display apparatus according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Like reference numerals refer to like elements throughout.

Hereinafter, the present disclosure will be explained in detail with reference to the accompanying drawings.

FIG. 1 illustrates a plan view of a display apparatus according to an exemplary embodiment of the present disclosure. Referring to FIG. 1, a display apparatus 500 includes a display panel 100, a gate driver 200, a data driver 300, and a driving circuit board 400.

Various display panels may be employed in the display apparatus 500. For instance, the display panel 100 may be a liquid crystal display panel that displays an image according to an alignment direction of liquid crystal molecules in a liquid crystal layer interposed between two electrodes facing each other, an organic electroluminescent light emitting display panel that displays an image using an organic electroluminescent light emitting layer interposed between two electrodes facing each other, and so forth.

The display panel 100 includes a display area DA in which a plurality of pixels PX11 to PXnm is arranged in a matrix configuration, a non-display area NDA surrounding the display area DA, a plurality of gate lines GL1 to GLn, and a plurality of data lines DL1 to DLm insulated from the gate lines GL1 to GLn while crossing the gate lines GL1 to GLn.

The pixels PX11 to PXnm are arranged in areas defined by the gate lines GL1 to GLn and the data lines DL1 to DLm. Thus, the pixels PX11 to PXnm are arranged in n rows by m columns. Each of "m" and "n" is an integer number greater than 0.

Each of the pixels PX11 to PXnm is connected to a corresponding gate line of the gate lines GL1 to GLn and a corresponding data line of the data lines DL1 to DLm. The pixels PX11 to PXnm receive data voltages through the corresponding data lines in response to gate signals provided through the corresponding gate lines. The pixels PX11 to PXnm display grayscales corresponding to the data voltages.

The gate lines GL1 to GLn are connected to the gate driver 200 to sequentially receive the gate signals. The data lines GL1 to DLm are connected to the data driver 300 to receive the data voltages in analog form.

The gate driver 200 is disposed in the non-display area NDA adjacent to one side of the display area DA. For example, the gate driver 200 may be mounted on the non-display area NDA adjacent to a left side of the display area DA in an amorphous silicon TFT gate driver circuit (ASG).

The gate driver 200 generates the gate signals in response to gate control signals applied from a timing controller (not shown) mounted on the driving circuit board 400. The gate signals may be sequentially applied to the pixels PX11 to PXnm through the gate lines GL1 to GLn in the row by row. Thus, the pixels are driven in the row by row.

The data driver 300 receives image signals and data control signals from the timing controller. The data driver 300 generates the data voltages in analog form to correspond to the image signals in response to the data control signals. The data driver 300 applies the data voltages to the pixels PX11 to PXnm through the data lines DL1 to DLm.

The data driver 300 may include a plurality of source driving chips 310_1 to 310_i. Here, "i" is an integer number greater than 0 and smaller than "m". Each of the source driving chips 310_1 to 310_i is mounted on a corresponding flexible printed circuit board of flexible printed circuit boards 320_1 to 320_i and connected to the non-display area NDA adjacent to the driving circuit board 400 and an upper portion of the display area DA.

In the present exemplary embodiment, the source driving chips 310_1 to 310_i are mounted on the flexible printed circuit boards 320_1 to 320_i by a tape carrier package (TCP) method. Alternatively, the source driving chips 310_1 to 310_i may be mounted on the non-display area NDA adjacent to the upper portion of the display area DA by a chip on glass (COG) method, or other suitable methods.

Figure 2:
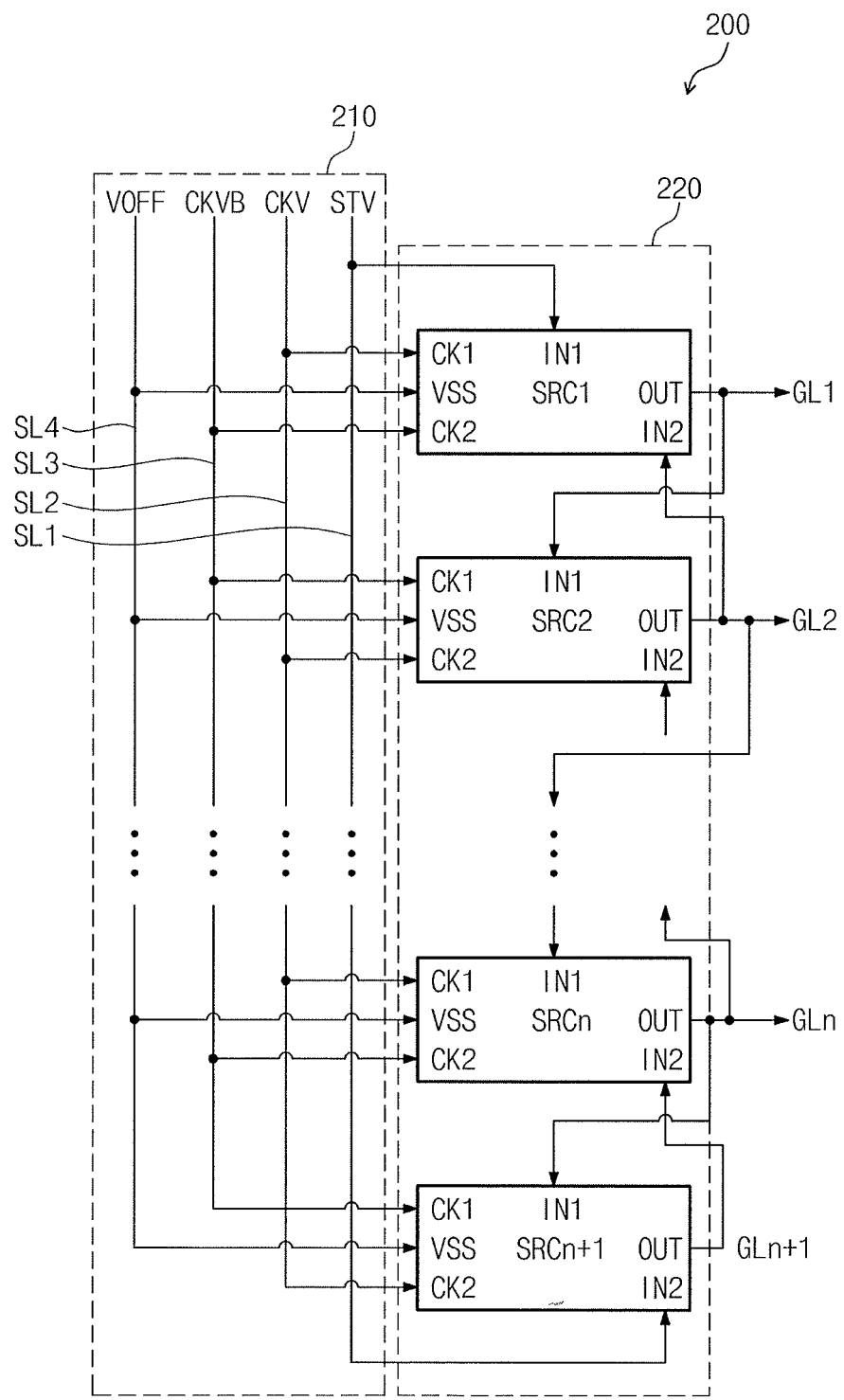
FIG. 2 illustrates a block diagram of a gate driver of FIG. 1.

FIG. 2 illustrates a block diagram showing the gate driver of FIG. 1. Referring to FIG. 2, the gate driver 200 includes a line part 210 to receive the gate control signals STV, CKV, CKVB, and VOFF, and a shift register 220 to receive the gate control signals STV, CKV, CKVB, and VOFF from the line part 210.

The shift register 220 sequentially outputs the gate signals in response to the gate control signals STV, CKV, CKVB, and VOFF. The gate signals are sequentially applied to the pixels PX11 to PXnm through the gate lines GL1 to GLn in the unit of row.

The gate control signals STV, CKV, CKVB, and VOFF include a vertical start signal STV, a first clock signal CKV, a second clock signal CKVB having a phase opposite to that of the first clock signal CKV, and an off-voltage VOFF corresponding to a ground voltage.

The line part 210 includes signal lines SL1, SL2, SL3, and SL4 to receive the gate control signals STV, CKV, CKVB, and VOFF, and to apply the gate control signals STV, CKV, CKVB, and VOFF to the shift register 220. The signal lines SL1 to SL4 include a first signal line SL1 to receive the vertical start signal STV, a second signal line SL2 to receive the first clock signal CKV, a third signal line SL3 to receive the second clock signal CKVB, and a fourth signal line SL4 to receive the off-voltage VOFF.

The shift register 220 includes a plurality of stages SRC1 to SRCn+1 that are cascaded. The stages SRC1 to SRCn+1 sequentially output the gate signals in response to the gate control signals STV, CKV, CKVB, and VOFF provided from the first to fourth signal lines SL1 to SL4. First to n-th stages SRC1 to SRCn of the stages SRC1 to SRCn+1 serve as driving stages, and an (n+1)th stage SRCn+1 may serve as a dummy stage.

Each of the stages SRC1 to SRCn+1 includes a first input terminal IN1, a second input terminal IN2, a first clock terminal CK1, a second clock terminal CK2, a ground voltage terminal VSS, and an output terminal OUT.

The first clock terminal CK1 and the second clock terminal CK2 of odd-numbered stages SRC1, SRC3, . . . , SRCn of the stages SRC1 to SRCn+1 respectively receive the first clock signal CKV and the second clock signal CKVB. The first clock terminal CK1 and the second clock terminal CK2 of even-numbered stages SRC2, SRC4, . . . , SRCn+1 of the stages SRC1 to SRCn+1 respectively receive the second clock signal CKVB and the first clock signal CKV.

The output terminals OUT of the odd-numbered stages SRC1, SRC3, . . . , SRCn of the stages SRC1 to SRCn+1 output the gate signals that are synchronized with the first clock signal CKV. The output terminals OUT of the even-numbered stages SRC2, SRC4, . . . , SRCn+1 of the stages SRC1 to SRCn+1 output the gate signals that are synchronized with the second clock signal CKVB.

Except for the dummy stage SRCn+1, the output terminals OUT of the first to n-th stages SRC1 to SRCn are connected to corresponding gate lines of the gate lines GL1 to GLn. The gate signals output from the output terminals OUT of the first to n-th stages SRC1 to SRCn are sequentially applied to the gate lines GL1 to GLn.

The gate signal output through the output terminal OUT is applied to the second input terminal IN2 of a previous stage and the first input terminal IN1 of a next stage. That is, the first input terminal IN1 of a present stage receives the gate signal of the previous stage, and the second input terminal IN2 of the present stage receives the gate signal of the next stage. The first input terminal IN1 of the first stage SRC1, which has no previous stage, and the second input terminal IN2 of the (n+1)th stage SRCn+1, which has no next stage, receive the vertical start signal STV.

The ground voltage terminals VSS of the stages SRC1 to SRCn+1 receive the off-voltage VOFF. As a distance between the line part 210 and the shift register 220 decreases, the likelihood that the line part 210 will be damaged by static electricity generated from the shift register 220 increases.

In the present exemplary embodiment, the distance between the line part 210 and the shift register 220 of the gate driver 200 may be set to prevent the line part 210 from being damaged due to the static electricity in the shift register 220. For instance, the line part 210 is disposed apart from the shift register 220 with a first distance. The first distance is equal to or greater than about 20 μm. Detailed description of the above structure will be described in detail with reference to FIGS. 4 to 6.

Figure 3:
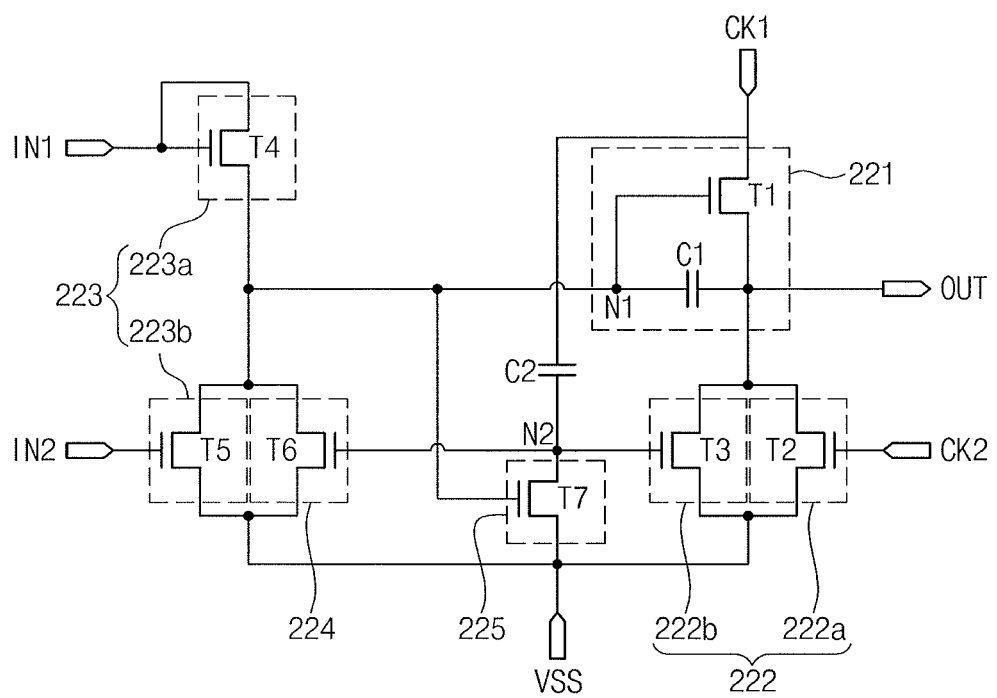
FIG. 3 illustrates a circuit diagram of a stage of FIG. 2.

FIG. 3 illustrates a circuit diagram showing a stage of FIG. 2. FIG. 3 illustrates a circuit diagram of an arbitrary stage SRCk. Here, "k" is an integer number greater than 1 and smaller than "n". Although not shown in figures, the other stages have the same structure and function as those of the stage shown in FIG. 3. Thus, hereinafter the circuit diagram of only one stage will be described in detail with reference to FIG. 3.

Referring to FIG. 3, the stage SRCk of the shift register 220 includes a pull-up part 221, a pull-down part 222, a pull-up driving part 223, a ripple preventing part 224, and a pull-down control part 225.

The pull-up part 221 receives the first clock signal CKV through the first clock terminal CK1. The pull-up part 221 outputs the first clock signal CKV to the output terminal OUT to pull up the gate signal in response to a voltage of a first node N1.

The pull-up part 221 includes a first transistor T1 and a charge capacitor C1. The first transistor T1 includes a drain electrode connected to the first clock terminal CK1, a source electrode connected to the output terminal OUT, and a gate electrode connected to the first node N1.

The charge capacitor C1 is disposed between the gate electrode and the source electrode of the first transistor T1. The charge capacitor C1 stores the gate signal (or the vertical start signal STV) at a high level of the previous stage, which is provided through the first input terminal IN1, to turn on the first transistor T1.

The pull-down part 222 pulls down the gate signal output to the output terminal OUT to the off-voltage VOFF in response to the first clock signal CKV and the second clock signal CKVB applied thereto through a second node N2.

The pull-down part 222 includes a first pull-down part 222a and a second pull-down part 222b. The first pull-down part 222a pulls down the gate signal output to the output terminal OUT to the off-voltage VOFF in response to the second clock signal CKVB applied thereto through the second clock terminal CK2. The second pull-down part 222b pulls down the gate signal output to the output terminal OUT to the off-voltage VOFF in response to the first clock signal CKV applied thereto through the second node N2.

The first pull-down part 222a includes a second transistor T2. The second transistor T2 includes a drain electrode connected to the output terminal OUT, a source electrode connected to the ground voltage terminal VSS, and a gate electrode connected to the second clock terminal CK2.

The second pull-down part 222b includes a third transistor T3. The third transistor T3 includes a drain electrode connected to the output terminal OUT, a source electrode connected to the ground voltage terminal VSS, and a gate electrode connected to a switching capacitor C2 through the second node N2.

The pull-up driving part 223 is connected to the first node N1. The pull-up driving part 223 turns on the pull-up part 221 in response to the gate signal of the previous stage and turns off the pull-up part 221 in response to the gate signal of the next stage.

The pull-up driving part 223 includes a first pull-up driving part 223a and a second pull-up driving part 223b. The first pull-up driving part 223a turns on the pull-up part 221 in response to the gate signal at the high level of the previous stage received through the first input terminal IN1. The second pull-up driving part 223b turns off the pull-up part 221 in response to the gate signal at the high level of the next stage received through the second input terminal IN2.

The first pull-up driving part 223a includes a fourth transistor T4. The fourth transistor T4 includes a drain electrode and a gate electrode that are commonly connected to the first input terminal IN1, and a source electrode connected to the first node N1.

The second pull-up driving part 223b includes a fifth transistor T5. The fifth transistor T5 includes a drain electrode connected to the first node N1, a gate electrode connected to the second input terminal IN2, and a source electrode connected to the ground voltage terminal VSS.

The gate electrode of the first transistor T1 connected to the first node N1 serves as a control terminal that turns on or turns off the pull-up part 221.

The fourth transistor T4 is turned on in response to the gate signal at the high level of the previous stage. The gate signal at the high level of the previous stage is provided to the first node N1 by the turned-on fourth transistor T4, and thus the charge capacitor C1 is charged with the gate signal at the high level of the previous stage.

When the charge capacitor C1 is charged with electric charges greater than a threshold voltage of the first transistor T1 and the level of the first clock signal CKV is changed to the high level from the low level, the charge capacitor C1 is bootstrapped. Thus, the first clock signal CKV at the high level is output through the output terminal OUT.

Then, when the fifth transistor T5 is turned on in response to the gate signal at the high level of the next stage, the electric charges charged in the charge capacitor C1 are discharged to the off-voltage VOFF of the ground voltage terminal VSS. The level of the first node N1 is transited to the low level by the discharge of the charge capacitor C1. Thus, the first transistor T1 is turned off, and an output of the first clock signal CKV is stopped.

When the first transistor T1 is turned off and the second transistor T2 is turned on simultaneously, the gate signal output to the output terminal OUT transitions to the off-voltage VOFF. In addition, the first clock signal CKV at the high level, which is charged in the switching capacitor C2, is applied to the third transistor T3 through the second node N2.

The third transistor T3 is turned on in response to the first clock signal CKV at the high level. Thus, the gate signal output to the output terminal OUT is uniformly maintained in the low level. That is, the second transistor T2 and the third transistor T3 are alternately turned on to pull down the gate signal output to the output terminal OUT to the low level.

After the level of the gate signal transitions to the low level by the pull-down part 222, the ripple preventing part 224 maintains the level of the first node N1 in the off-voltage VOFF, which is the low level, to turn off the pull-up part 221. Also, the ripple preventing part 224 prevents a ripple of the first node N1, which is caused by a coupling of the first clock signal CKV.

The ripple preventing part 224 includes a sixth transistor T6. The sixth transistor T6 includes a drain electrode connected to the first node N1, a gate electrode connected to the switching capacitor C2 through the second node N2, and a source electrode connected to the ground voltage terminal VSS.

The pull-down control part 225 turns off the ripple preventing part 224 in response to the voltage of the first node N1. The pull-down control part 225 includes a seventh transistor T7. The seventh transistor T7 includes a drain electrode connected to the second node N2, a gate electrode connected to the first node N1, and a source electrode connected to the ground voltage terminal VSS.

When the first clock signal CKV at the high level is applied to the second node N2 through the switching capacitor C2 and a signal of the first node N1 has the high level, the seventh transistor T7 is turned on to transit the level of the second node N2 to the low level. Thus, when the first node N1 has the high level, the ripple preventing part 224 is turned off even though the first clock signal CKV has the high level in a period during which the pull-up part 221 is turned on.

The switching capacitor C2 stores the first clock signal CKV and applies the stored first clock signal CKV to the ripple preventing part 224 and the second pull-down part 222b of the pull-down part 222. A first terminal of the switching capacitor C2 is connected to the first clock terminal CK1 and a second terminal of the switching capacitor C2 is connected to the gate electrodes of the third and sixth transistors T3 and T6 and the drain electrode of the seventh transistor T7 through the second node N2.

The switching capacitor C2 stores the first clock signal CKV and applies the stored first clock signal CKV to the second node N2 to turn on and off the third and sixth transistors T3 and T6.

Figure 4:
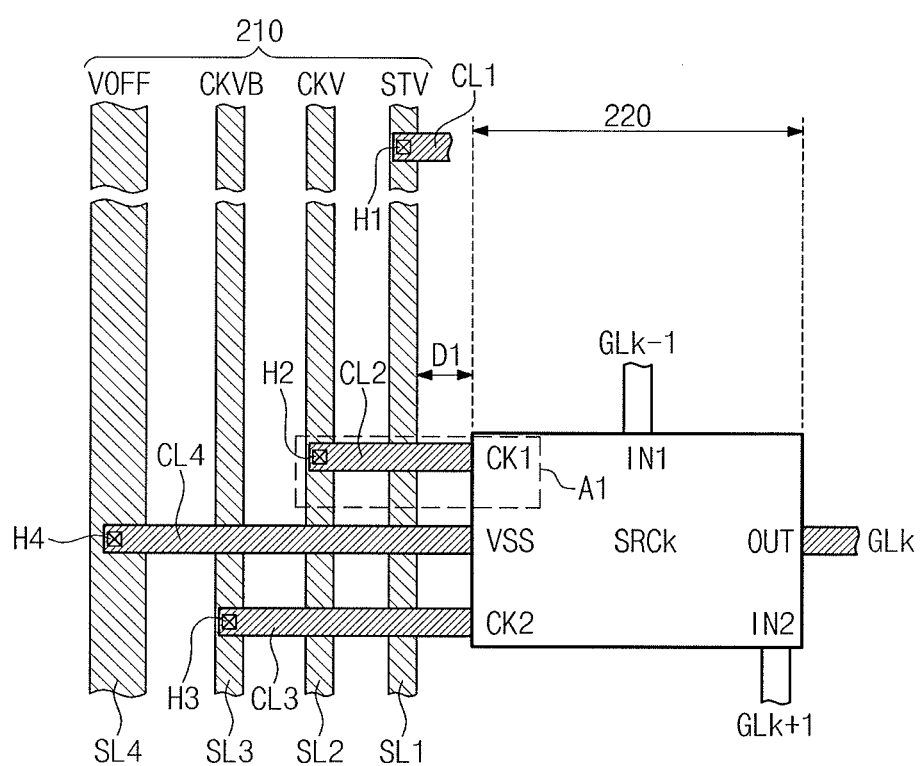
FIG. 4 illustrates a plan view of a line part and a stage of FIG. 2.

FIG. 4 illustrates a plan view of the line part and the stage of FIG. 2. FIG. 4 shows a connection structure of the line part 210 and only one stage SRCk, however, the line part and the other stages have the same connection structure as that of the line part and the one stage shown in FIG. 4. Hereinafter, the connection structure of the line part 210 and the one stage SRCk will be described in detail.

Referring to FIG. 4, the first signal line SL1 receiving the vertical start signal STV is connected to a first connection line CL1 through a first contact hole H1. Although not shown in figures, the first signal line SL1 is connected to the first stage SRC1 through the first connection line CL1. In addition, the first signal line SL1 is connected to the (n+1)th stage SRCn+1 through the same connection line as the first connection line CL1.

The second signal line SL2 receiving the first clock signal CKV is connected to a second connection line CL2 through a second contact hole H2. The second connection line CL2 is connected to the first clock terminal CK1 of the stage SRCk.

The third signal line SL3 receiving the second clock signal CKVB is connected to a third connection line CL3 through a third contact hole 113. The third connection line CL3 is connected to the second clock terminal CK2 of the stage SRCk.

The fourth signal line SL4 receiving the off-voltage VOFF is connected to a fourth connection line CL4 through a fourth contact hole H14. The fourth connection line CL4 is connected to the ground voltage terminal VSS of the stage SRCk.

The first to fourth signal lines SL1 to SL4 may be substantially simultaneously patterned and formed on the same layer. The first to fourth connection lines CL1 to CL4 may be substantially simultaneously patterned and formed on the same layer while interposing an insulating layer between the first to fourth signal lines SL1 to SL4 and the first to fourth connection lines CL1 to CL4. The first to fourth signal lines SL1 to SL4 are extended in a column direction. The first to fourth connection lines CL1 to CL4 are extended in a row direction crossing the column direction.

The line part 210 is spaced apart from the shift register 220 with a first distance D1. The first distance D1 is set to a distance enough to prevent the line part 210 from being damaged due to the static electricity in the shift register 220. The first distance D1 is equal to or greater than about 20 μm.

In detail, one signal line of the first to fourth signal lines SL1 to SL4 of the line part 210 is disposed adjacent to the stage SRCk of the shift register 220. For instance, as shown in FIG. 4, the first signal line SL1 is disposed adjacent to the stage SRCk, but embodiments are not limited thereto or thereby. For example, one of the remaining signal lines SL2, SL3, and SL4 may be disposed adjacent to the stage SRCk. In addition, although not shown in figures, the first signal line SL1 may be disposed adjacent to the other stages except for the stage SRCk.

Static electricity may be generated from the shift register 220. The static electricity is discharged to the closest signal line, e.g., the first signal line SL1, adjacent the shift register 220. When the first signal line SL1 adjacent to the stages SRC1 to SRCn+1 of the shift register 220 is within a distance smaller than about 20 μm, the first signal line SL1 may be damaged due to heat caused by the static electricity generated in the shift register 220.

In contrast, in the present exemplary embodiment, the closest signal line, e.g., the first signal line SL1, is disposed apart from the stage SRCk by the first distance D1. The first distance D1 is set to the distance required to prevent the first signal line SL1 of the line part 210 from being damaged by the static electricity generated from the shift register 220. Thus, the first signal line SL1 is prevented from being damaged by the static electricity generated from the shift register 220.

Figure 5:
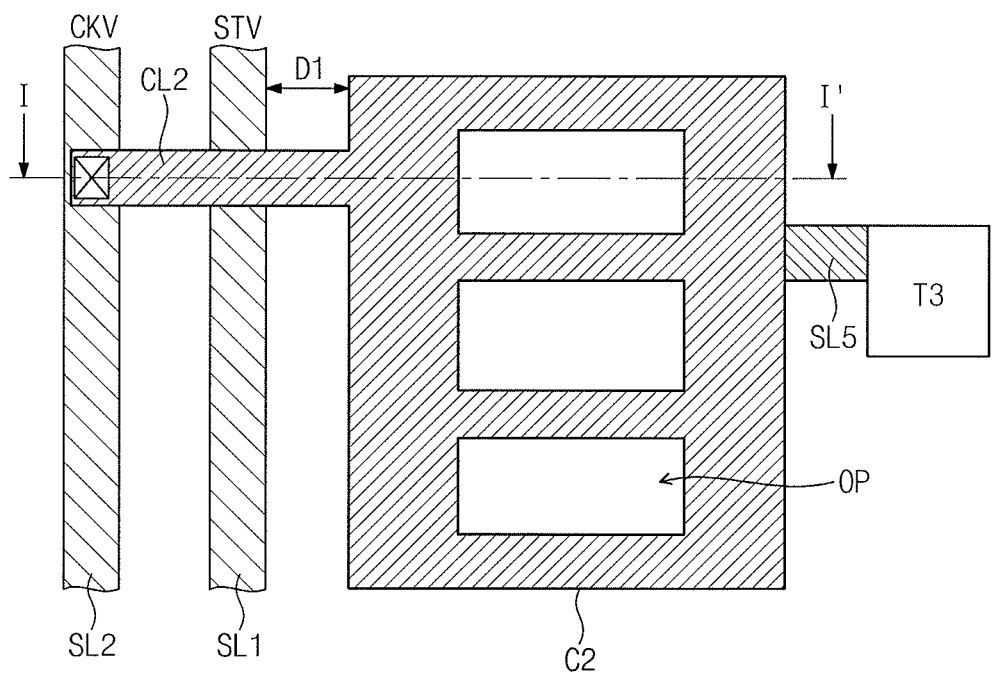
FIG. 5 illustrates a partially enlarged view of a first area of FIG. 4.
Figure 6:
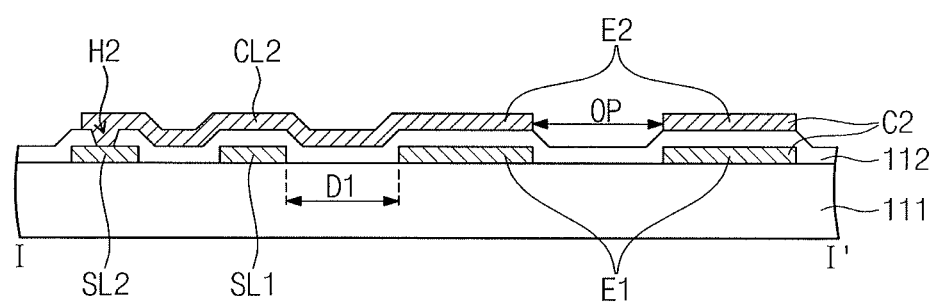
FIG. 6 illustrates a cross-sectional view taken along a line I-I' of FIG. 3.

FIG. 5 illustrates a partially enlarged view showing a first area of FIG. 4, and FIG. 6 is a cross-sectional view taken along a line I-I' of FIG. 3. For the convenience of explanation, FIGS. 5 and 6 show only the first signal line SL1, the second signal line SL2, the second connection line CL2, the switching capacitor C2 connected to the second connection line CL2, and the third transistor T3 connected to the switching capacitor C2.

Referring to FIGS. 5 and 6, the second connection line CL2 connected to the second signal line SL2 is connected to the switching capacitor C2. Thus, the first clock signal CKV is applied to the switching capacitor C2 as described above.

Although not shown, an area of the switching capacitor C2 connected to the second connection line CL2 may serve as the first clock terminal CK1 applied with the first clock signal CKV.

The switching capacitor C2 is connected to the third transistor T3 as described above. The switching capacitor C2 is connected to the third transistor T3 by a fifth signal line SL5. The fifth signal line SL5 is formed on the same layer as the first to fourth signal lines SL1 to SL4.

The switching capacitor C2 is disposed at a leftmost side of the stage SRCk. That is, a left side boundary of the switching capacitor C2 may be a left side boundary of the stage SRCk.

One signal line of the first to fourth signal lines SL1 to SL4 of the line part 210 is disposed adjacent to the stage SRCk of the switching capacitor C2. For example, the first signal line SL1 is disposed adjacent to the switching capacitor C2 of the stage SRCk as shown in FIGS. 5 and 6. Alternatively, any one of the remaining signal lines SL2, SL3, and SL4 may be disposed adjacent to the switching capacitor C2 of the stage SRCk.

The display panel 100 includes a base substrate 111. The first and second signal lines SL1 and SL2 are disposed on the base substrate 111 to be spaced apart from each other. Although not shown in figures, the third and fourth signal lines SL3 and SL4 are disposed on the base substrate 111 to be spaced apart from each other.

The switching capacitor C2 includes a first electrode E1 and a second electrode E2 that overlap each other while interposing an insulating layer 112 therebetween, and a plurality of openings OP. The first electrode E1 may be formed on the same layer as the first and second signal lines SL1 and SL2. The second electrode E2 may be formed on the same layer as the second connection line CL2. Thus, as can be seen therein, an electrode, e.g., the first electrode E1, of a capacitor, e.g., the switching capacitor C2, closest to the line unit is on a same level as the signal line closest thereto, e.g., signal line SL1, and the distance D1 is between the first electrode E1 and the first signal line SL1 at the same level.

The insulating layer 112 is on the base substrate 111 and covers the first electrode E1, the first signal line SL1, and the second signal line SL2. Although not shown in FIGS. 5 and 6, the first, third, and fourth connection lines CL1, CL3, and CL4 are formed on the insulating layer 112 and are spaced apart from each other.

The second connection line CL2 is connected to the second signal line SL2 through the second contact hole H2. The second connection line CL2 is extended to be connected to the second electrode E2 of the switching capacitor C2.

As an exemplary embodiment, three openings OP have been shown in FIG. 5, however, the number of the openings OP of the switching capacitor C2 should not be limited to three. As an area of the openings OP becomes smaller, an area of the first and second electrodes E1 and E2 becomes larger, and thus an aperture ratio of the switching capacitor C2 becomes smaller.

When the liquid crystal display panel is used as the display panel 100, the display panel 100 includes a first substrate (not shown) having pixel electrodes (not shown) of the pixels PX11 to PXnm, a second substrate (not shown) having a common electrode (not shown) disposed to face the first substrate, and a liquid crystal layer (not shown) interposed between the first and second substrates.

The first substrate is coupled to the second substrate by a sealant (not shown) provided in the non-display area NDA. The sealant may be cured by ultraviolet rays. As the aperture ratio of the switching capacitor C2 becomes smaller, the area of the first and second electrodes E1 and E2 becomes larger. The ultraviolet rays are blocked by the first and second electrodes E1 and E2 of the switching capacitor C2. Since an amount of the ultraviolet rays irradiated onto the sealant is reduced when the area of the first and second electrodes E1 and E2 becomes larger, the cure rate of the sealant is reduced. Thus, the switching capacitor C2 is required to have the aperture ratio higher than a predetermined aperture ratio in order to secure the cure rate of the sealant.

An entire area of the openings OP is more than about 40% of an area defined by an outer boundary of the switching capacitor C2. That is, the switching capacitor C2 may have the aperture ratio of about 40% or more in order to secure the appropriate cure rate. Although not shown in figures, the charge capacitor C1 includes a plurality of openings, and the charge capacitor C1 may have the aperture ratio of about 40% or more.

The static electricity may be generated from the switching capacitor C2 of the stage SRCk. The static electricity from the switching capacitor C2 is discharged through the closest signal line thereto, e.g., the first signal line SL1, adjacent to the switching capacitor C2. When the first signal line SL1 and the switching capacitor C2 are disposed apart from each other with the distance smaller than about 20 μm, the first signal line SL1 may be damaged by the heat caused by the static electricity discharged from the switching capacitor C2.

In the present exemplary embodiment, the first signal line SL1 of the line part 210 and the switching capacitor C2 of the stage SRCk are disposed apart from each other by the first distance D1. The first distance D1 is set to prevent the damage of the first signal line SL1 due to the static electricity generated from the switching capacitor C2. That is, the first distance D1 is set to be equal to or greater than about 20 μm.

Consequently, the gate driver 200 and the display apparatus 500 including the gate driver 200 may prevent the damage of the line part 210, which is caused by the static electricity in the capacitor.

By way of summation and review, one or more embodiments may provide a gate driver and a display apparatus including the gate driver may prevent the line part from being damaged due to the static electricity generated in the capacitor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A gate driver, comprising:
   a line part that receives control signals and includes a first signal line; and
   a shift register that sequentially outputs gate signals in response to the control signals provided from the line part, wherein
   the first signal line of the line part closest to the shift register is separated apart from an outmost side of the shift register facing the first signal line of the line part by a first distance equal to or greater than about 20 μm, and wherein the first signal line extends along the outmost side of the shift register.

2. The gate driver as claimed in claim 1, wherein:

the line part includes a plurality of signal lines including the first signal line, the signal lines to receive the control signals and provide the control signals to the shift register, the shift register includes a plurality of stages connected one after another to each other to sequentially output the gate signals in response to the control signals provided from the signal lines, and the first signal line of the signal lines is disposed adjacent to the stages, and is disposed apart from the stages with the first distance.

3. The gate driver as claimed in claim 2, wherein:

the control signals include:
    a vertical start signal;
    a first clock signal;
    a second clock signal having a phase opposite to the first clock signal; and
    an off-voltage defined as a ground voltage; and the signal lines include:
    the first signal line that receives the vertical start signal and applies the vertical start signal to a first stage and a last stage among the stages;
    a second signal line that receives the first clock signal and applies the first clock signal to the stages;
    a third signal line that receives the second clock signal and applies the second clock signal to the stages; and
    a fourth signal line that receives the off-voltage and applies the off-voltage to the stages.

4. The gate driver as claimed in claim 3, wherein each of the stages comprises:

a pull-up part that receives the first clock signal and pulls up the gate signal in response to a voltage of a first node;

a pull-down part that pulls down the gate signal to the off-voltage in response to a voltage of a second node and the second clock signal;

a pull-up driving part that is connected to the first node, turns on the pull-up part in response to a gate signal of a previous stage, and turns off the pull-up part in response to a gate signal of a next stage;

a ripple preventing part that maintains the first node at the off-voltage in response to the voltage of the second node;

a pull-down control part that converts the voltage of the second node in response to the voltage of the first node to turn off the ripple preventing part; and a switching capacitor that receives the first clock signal to store the first clock signal and applies the stored first clock signal to the second node, and the pull-up driving part receives the vertical start signal when the previous stage or the next stage does not exist.

5. The gate driver as claimed in claim 4, wherein:

the switching capacitor and the first signal line are disposed adjacent to each other, and the first signal line and the switching capacitor are disposed apart from each other with the first distance.

6. The gate driver as claimed in claim 4, wherein the switching capacitor comprises a plurality of openings, an entire area of the openings being greater than about 40% of an entire area of the switching capacitor that is defined by an outer boundary of the switching capacitor.

7. The gate driver as claimed in claim 1, wherein the first signal line of the line part is adjacent to the outmost of the shift register.

8. The gate driver as claimed in claim 7, wherein the first signal line of the line part receives a vertical start signal.

9. The gate driver as claimed in claim 1, wherein the first distance is determined to prevent damage of the first signal line from static electricity from the shift register.

10. A display apparatus, comprising:

a plurality of pixels that receives data signals in response to gate signals and displays grayscales corresponding to data signals;

a gate driver that sequentially applies the gate signals to the pixels in response to gate control signals; and a data driver that applies the data signals to the pixels, the gate driver including:
    a line part that receives control signals and includes a first signal line; and
    a shift register that sequentially outputs the gate signals in response to the control signals provided from the line part, wherein
    the first signal line of the line part closest to the shift register is separated apart from an outmost side of the shift register facing the first signal line of the line part by a first distance equal to or greater than about 20 μm, and wherein the first signal line extends along the outmost side of the shift register.

11. The display apparatus as claimed in claim 10, wherein:

the line part includes a plurality of signal lines including the first signal line, the signal lines to receive the control signals and provide the control signals to the shift register, the shift register includes a plurality of stages connected one after another to each other to sequentially output the gate signals in response to the control signals provided from the signal lines, and the first signal line of the signal lines is disposed adjacent to the stages, and is disposed apart from the stages with the first distance.

12. The display apparatus as claimed in claim 11, wherein the gate control signals comprise:

a vertical start signal;
a first clock signal;
a second clock signal having a phase opposite to the first clock signal; and
an off-voltage defined by a ground voltage, and the signal lines comprise:
the first signal line that receives the vertical start signal and applies the vertical start signal to a first stage and a last stage of the stages;
a second signal line that receives the first clock signal and applies the first clock signal to the stages;
a third signal line that receives the second clock signal and applies the second clock signal to the stages; and
a fourth signal line that receives the off-voltage and applies the off-voltage to the stages.

13. The display apparatus as claimed in claim 12, wherein each of the stages comprises:

a pull-up part that receives the first clock signal and pulls up the gate signal in response to a voltage of a first node;

a pull-down part that pulls down the gate signal to the off-voltage in response to a voltage of a second node and the second clock signal;

a pull-up driving part that is connected to the first node, turns on the pull-up part in response to a gate signal of a previous stage, and turns off the pull-up part in response to a gate signal of a next stage;

a ripple preventing part that maintains the first node at the off-voltage in response to the voltage of the second node;

a pull-down control part that converts the voltage of the second node in response to the voltage of the first node to turn off the ripple preventing part; and a switching capacitor that receives the first clock signal to store the first clock signal and applies the stored first clock signal to the second node, and the pull-up driving part receives the vertical start signal when the previous stage or the next stage does not exist.

14. The display apparatus as claimed in claim 13, wherein:

the switching capacitor and the first signal line are disposed adjacent to each other, and the first signal line and the switching capacitor are disposed apart from each other with the first distance.

15. The display apparatus as claimed in claim 13, wherein the switching capacitor comprises a plurality of openings and an entire area of the openings is greater than about 40% of an entire area of the switching capacitor, which is defined by an outer boundary of the switching capacitor.

16. A gate driver, comprising:

a line part that receives control signals; and a shift register including a capacitor, the shift register that sequentially outputs gate signals in response to the control signals provided from the line part, wherein a line in the line part closest to the shift register is separated apart from an outmost side of the capacitor closest to the line part by a first distance equal to or greater than about 20 μm, and wherein the outmost side of the capacitor is at an outmost side of the shift register facing the line in the line part, and wherein the line in the line part extends along the outmost side of the capacitor.

17. The gate driver as claimed in claim 16, wherein the line and an electrode of the capacitor are at a same level and separated by the first distance.

18. The gate driver as claimed in claim 17, wherein the line and the electrode are on a same surface of a substrate.

* * * * *